Aug. 16, 1960 L. A. JARVIS ET AL 2,949,497

THERMOELECTRIC ASSEMBLY

Filed March 5, 1958

INVENTORS.
Lactance A. Jarvis
John B. Heinicke
By: Schroeder, Hofgren, Brady & Wegner
Attys.

United States Patent Office 2,949,497 Patented Aug. 16, 1960

2,949,497

THERMOELECTRIC ASSEMBLY

Lactance A. Jarvis and John B. Heinicke, Benton Harbor, Mich., assignors to Whirlpool Corporation, a corporation of Delaware Filed Mar. 5, 1958, Ser. No. 719,345

5 Claims. (Cl. 136—4)

This invention relates to a thermoelectric assembly.

In heating or cooling by a thermoelectric device, thermoelectric means are provided in which hot and cold junctions are provided between pairs of dissimilar thermoelectric elements when thermoelectrically interconnected to either pump heat to or extract heat from one side of the device. In such devices it is desirable to provide a rigid strong assembly which will result in relatively unbreakable joints between the thermoelectric element and its associated terminal members. Also the assembly should be constructed in a manner to permit simple insertion or replacement of an element.

One of the features of this invention is to provide an improved thermoelectric assembly comprising a hollow dielectric connector, a thermoelectric element within said connector, a pair of spaced apart terminal members fastened to said connector and positioned one adjacent each end thereof with one terminal member in electrically conducting relation with said element, and a cap removably mounted in an opening through said other terminal member in electrical conducting relationship with said element, the opening having cross sectional dimensions at least equal to those of the thermoelectric element to permit passage of the element therethrough.

Other features and advantages of the invention will be apparent from the following description of certain embodiments thereof taken in conjunction with the accompanying drawings, in which.

Figure 1:
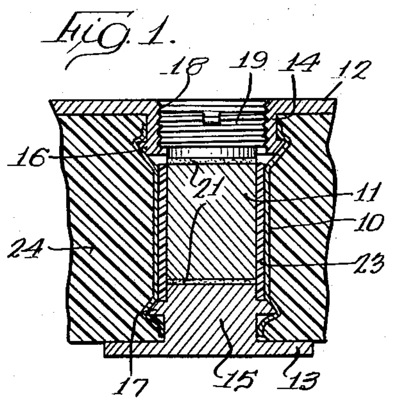
Figure 1 is a vertical sectional elevational view of a thermoelectric assembly embodying the invention.

In the embodiment shown in Figure 1, a hollow dielectric connector 10 has a thermoelectric element 11 positioned therein and a pair of spaced apart terminal members 12 and 13 positioned adjacent opposite ends of the element.

The hollow connector 10 is formed of a material of high dielectric and thermal insulation properties, preferably of polyvinylchloride, polyethylene, polystyrene or a phenol-formaldehyde impregnated paper or cloth or other suitable material to avoid electrically connecting the spaced apart terminal members 12 and 13. The terminal members are formed of electrically conducting material and copper or aluminum are good examples of such a material.

The terminal members 12 and 13 have projections 14 and 15, respectively, extending inwardly toward each other with the projection 14 formed as an annular collar and each of the projections has a peripheral flange 16 and 17, respectively, over which opposite ends of the hollow connector 10 extend to hold the spaced apart terminal members 12 and 13 in assembled relation.

The terminal member 12 is provided with an opening 18 of a size to permit passage of the thermoelectric element 11 therethrough and a cap 19 having cross sectional dimensions of a size at least equal to the cross sectional dimensions of the thermoelectric element is threadably retained in the opening 18. The cap 19 preferably is of a metal similar to that of the terminal member 12 and is in electrically conducting relation with the thermoelectric element 11 as is the inwardly extending projection 15 on the terminal member 13. This relation is facilitated by a disc of electrically conducting material 21 at each end of the thermoelectric element.

A guide 23 in the form of a hollow member formed of a hard plastic, such as nylon or other suitable material, is positioned within the hollow connector 10 and has one end resting on the peripheral flange 17 on the terminal member projection 15 and the other end adjacent to the flange 16. This guide 23 receives the thermoelectric element 11 and facilitates assembly or replacement of the element.

With the cap 19 removed from the opening 18 the thermoelectric element may be inserted or withdrawn from within the hollow guide 23 and the cap 19 then placed within the opening and tightly threaded against the thermoelectric element 11 to make a good electrical connection between the element 11 and terminal members 12, 13.

The space between the terminal members 12 and 13 is preferably filled with a thermal and electrical insulating material 24. The thermal and electrical insulating material may be any of the well known plastics, preferably a foamed plastic that is substantially rigid and that preferably is foamed in place. Among the foamed plastics that may be used are foamed polystyrene, foamed polyurethane and the like. Because of its excellent physical properties and because it may be foamed in place to adhere firmly to the surfaces which it contacts to produce a rigid block, a foamed, rigid polyurethane is preferred. These are well known and widely used materials and are easily produced. In general the foamed, rigid polyurethanes are produced by reacting an organic diisocyanate such as toluene 2,4-diisocyanate with a polyester of a dibasic acid and a trihydric alcohol in which the ester contains free hydroxy and carboxylic groups with the reaction taking place in the presence of water. Methods of producing such rigid polyurethane foams are disclosed, for example, in U.S. Patent 2,577,281 with Example 17 showing an excellent method of preparing such a rigid foam.

In a method disclosed in the above patent an alkyd resin is first produced as by reacting 4 mols of glycerol and 2.5 mols of adipic acid in the presence of 0.5 mol of phthalic anhydride. This resin is the polyester. This resin is then reacted with the diisocyanate and preferably water as the foaming agent, also preferably in the presence of a non-ionic wetting agent to promote more uniform cell formation. A catalyst such as benzoyl peroxide is also preferably included and if desired a flame retarding agent such as is disclosed in the patent.

Figure 2:
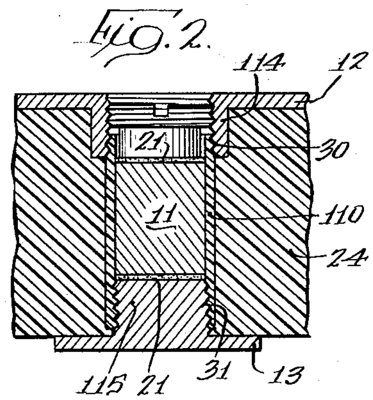
Figure 2 is a similar view illustrating a second embodiment of the invention.

In the embodiment shown in Figure 2, the hollow connector 110 is of a size to directly receive the thermoelectric element 11 and at one end is threadably connected to the annular collar 114 as indicated at 30. The hollow connector 110 at its opposite end is threadably connected on its inner side to the terminal member projection 115 as indicated at 31. The terminal projection 115 extends upwardly within the hollow connector 110 to be in electrical conducting relation with the thermoelectric element 11.

Figure 3:
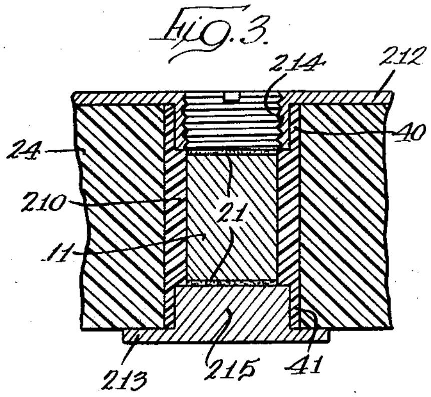
Figure 3 is a sectional elevational view illustrating a third embodiment of the invention.

In the embodiment shown in Figure 3, the hollow connector 210 is in the form of a tube of a material of high dielectric properties and may be made from materials set forth with respect to the hollow connector 10 of Figure 1. The hollow connector 210 has its ends 40 and 41 formed as walls of reduced thickness tightly receiving the annular collar 214 of the terminal member 212 and the terminal projection 215 of the terminal member 213. The hollow connector 210 securely holds the terminal members 212 and 213 in assembled relation with the thermoelectric element 11.

Figure 4:
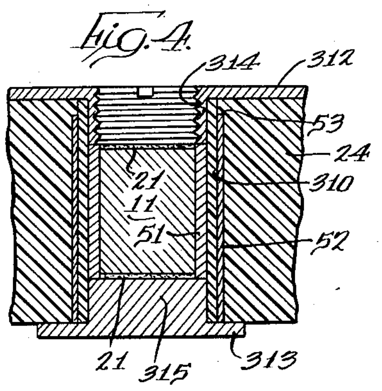
Figure 4 is a sectional elevational view of a fourth embodiment of the invention.

In the embodiment shown in Figure 4, the hollow connector 310 is formed in place by casting a thermosetting resin, such as an epoxy or polyester resin, with the terminal members 312 and 313 held in their proper spaced apart positions. In this assembly a hollow guide 51 is positioned between the annular collar 314 of the terminal member 312 and the terminal projection 315. This guide is in the form of a cardboard tube or other suitable material. A second tube 52 surrounds the guide 51 is spaced relation and extends between the terminal members 12 and 13. The guide 51 and tube 52 form a mold for the thermosetting resin placed therebetween so that the resin when cast extends between the terminal members 312 and 313 and closely fits the annular collar 314 and terminal projection 315. In order to place the resin between the guides 51 and 52 an opening 53 is provided at one end of the tube 52.

Figure 5:
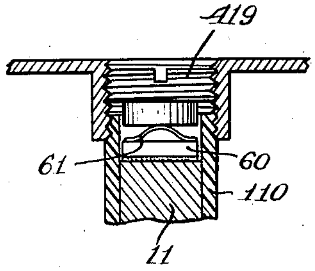
Figure 5 is a fragmentary sectional elevational view of a fifth embodiment of the invention.

In the embodiment shown in Figure 5, which closely corresponds to the embodiment shown in Figure 2, a plug 60 is positioned between the cap 19 and the thermoelectric element 11 and is resiliently urged toward the element 11 by a leaf spring 61 positioned in a space between the plug 60 and cap 19. The plug 60 and spring 61 are both formed of electrically conducting material so as to maintain the circuit through the terminal members 12 and 13 and thermoelectric element 11.

The resilient mounting of the plug 60 maintains good electrical connection between the parts.

In all the embodiments disclosed herein the parts are assembled in rigid relation to provide a sturdy structure and are provided with an easily removed cap to enable simple installation of the thermoelectric element.

An assembly somewhat similar to those of this invention is shown, described and claimed in the copending application of John Roeder, Jr., Serial No. 720,793, filed March 11, 1958, and assigned to the same assignee.

Having described our invention as related to the embodiments shown in the accompanying drawings, it is our intention that the invention be not limited by any of the details of description, unless otherwise specified, but rather be construed broadly within its spirit and scope as set out in the accompanying claims.

We claim:

1. A thermoelectric assembly, comprising: a hollow dielectric connector; a pre-formed thermoelectric element within said connector; a pair of spaced apart terminal members fastened to said connector and positioned one adjacent each end thereof with one terminal member in electrically conducting relation with said element, the other terminal member being provided with an opening having cross sectional dimensions at least equal to those of the thermoelectric element to permit passage of the element therethrough; and a cap retained in said opening in electrical conductive relationship with said element, said other member and cap being provided with co-operating means permitting removal and installation of said cap relative to said opening while said other member is maintained in its position adjacent one end of the element.

2. A thermoelectric assembly, comprising: a hollow dielectric connector; a thermoelectric element within said connector; a pair of spaced apart terminal members fastened to said connector and positioned one adjacent each end thereof with one terminal member in electrically conducting relation with said element, the other terminal member having an opening of a size to permit passage of the element therethrough; and a cap removably threaded to said other terminal member normally closing said opening and in electrically conducting relation with the element, said cap being removable from said opening while said other terminal member is maintained in its position adjacent one end of the element.

3. The thermoelectric assembly of claim 2 including a disc positioned between the cap and element and a spring for urging the disc into engagement with the element.

4. The thermoelectric assembly of claim 1 wherein said other terminal member has an annular collar extending inwardly toward the thermoelectric element in which the cap is threaded, said collar defining said opening for receiving the cap.

5. The thermoelectric assembly of claim 2 including a pair of spaced hollow sleeves with the hollow connector positioned therebetween.

References Cited in the file of this patent

UNITED STATES PATENTS

| | | |
|---|---|---|
| 1,848,655 | Petrik | Mar. 8, 1932 |
| 2,844,638 | Lindenblad | July 22, 1958 |

FOREIGN PATENTS

| | | |
|---|---|---|
| 610,879 | Germany | Nov. 14, 1931 |